(12) United States Patent
Terratz et al.

(10) Patent No.: US 8,743,522 B2
(45) Date of Patent: Jun. 3, 2014

(54) MONITORING METHOD, CIRCUIT AND SYSTEM

(71) Applicant: Triune IP LLC, Richardson, TX (US)

(72) Inventors: Ross E. Terratz, McKinney, TX (US); Wayne T. Chen, Plano, TX (US); Brett Smith, McKinney, TX (US)

(*) Notice: Subject to any disclaimer, the term of this patent is extended or adjusted under 35 U.S.C. 154(b) by 0 days.

(21) Appl. No.: 13/663,111

(22) Filed: Oct. 29, 2012

(65) Prior Publication Data

US 2013/0049485 A1 Feb. 28, 2013

Related U.S. Application Data

(62) Division of application No. 12/363,095, filed on Jan. 30, 2009, now Pat. No. 8,300,375.

(60) Provisional application No. 61/082,372, filed on Jul. 21, 2008.

(51) Int. Cl.
*H02H 3/20* (2006.01)

(52) U.S. Cl.
USPC .......................................................... 361/90

(58) Field of Classification Search
None
See application file for complete search history.

(56) References Cited

U.S. PATENT DOCUMENTS

| | | | | | |
|---|---|---|---|---|---|
| 5,684,663 | A | * | 11/1997 | Mitter | 361/106 |
| 7,183,737 | B2 | * | 2/2007 | Kitagawa | 318/599 |
| 7,793,115 | B2 | * | 9/2010 | Tipley et al. | 713/300 |

* cited by examiner

*Primary Examiner* — Jared Fureman
*Assistant Examiner* — Terrence Willoughby
(74) *Attorney, Agent, or Firm* — Hovey Williams LLP

(57) ABSTRACT

A monitoring circuit for use with a monitored circuit having a power supply input and a load output. The monitoring circuit having a biasing module, a reference generator coupled to the power supply input and the biasing module, a comparator coupled to the monitored circuit and the reference generator and an output device coupled to the load output and activated at a predetermined signal threshold.

5 Claims, 8 Drawing Sheets

MONITORING METHOD, CIRCUIT AND SYSTEM

PRIORITY ENTITLEMENT

This application is a divisional application of patent application Ser. No. 12/363,095. This application is entitled to priority based on Provisional Patent Application Ser. No. 61/082,372 filed on Jul. 21, 2008, which is incorporated herein for all purposes by this reference. This application and the Provisional Patent Application have at least one common inventor.

TECHNICAL FIELD

The invention relates to low-power analog integrated circuitry. More particularly, the invention relates to microelectronic circuit architectures and methods for monitoring voltage, current, and power levels and protecting associated components and systems from being subjected to potentially harmful underload or overload conditions.

BACKGROUND

The need to conserve energy, concern for the environment, the minimization of battery footprints, and extension of battery life all converge to drive a need for microelectronic circuits, particularly in portable devices dependent upon battery power, to reduce power usage. For example, a common approach to control current consumption and protect power supplies such as batteries from potentially harmful load conditions is to implement a switch in series with the power supply. In operation, the switch is arranged to interrupt the connection to the power supply when the power rises or falls beyond a predetermined acceptable range, or when selectably switched through various methods. The trend in the art is to place more stringent efficiency requirements on such switching schemes. Ideally, power usage by such circuits would be zero power consumption in an "OFF" state, and minimal power consumption in an "ON" state.

In particular, battery powered applications create a pressing need for ultra-low current solutions in integrated circuits. For example, with lithium-ion and other common battery types, it is critical to monitor battery voltage. Too low or too high of a voltage placed on the battery can cause permanent electro-chemical changes to occur in the battery, causing damage or reducing the battery's charge capacity, diminishing its lifetime, or rendering it completely useless. Many circuits that are designed to monitor battery voltage are inescapably required to be powered by the very same battery that they monitor. For low-voltage detection and prevention (also known as undervoltage protection), this can be detrimental, since a constant current draw from the battery continues to decrease the battery voltage, placing the battery deeper into an undervoltage condition and exacerbating the potential for damage. Analogous problems can result from the occurrence of overvoltage conditions, undercurrent or overcurrent conditions, or underpower or overpower conditions. In each case, regardless of power supply type or battery type, circuit monitoring and switching reactive to monitored conditions would be beneficial for managing and protecting the power supply.

Due to these and other problems and potential problems, improved efficient voltage, current, and power level monitoring and switching circuits would be useful and advantageous in the arts.

SUMMARY

In carrying out the principles of the present invention, in accordance with preferred embodiments, the invention provides advances in the arts with novel systems, circuits and methods directed to providing efficient, low power consumption, monitoring and outputting reactive to monitored conditions.

According to aspects of the invention, preferred embodiments of a circuit monitoring method includes the step of providing a floating gate monitoring circuit in association with a monitored circuit. In a further step, the floating gate is programmed to a selected charge level. The programmed floating gate charge level is then compared with a signal level in a monitored circuit. In an additional step, selected comparison criteria are used for selectably activating an output relating to the monitored circuit.

According to alternative aspects of the invention, preferred embodiments include circuit monitoring methods with steps for comparing a programmed floating gate charge level with a voltage or current level in the monitored circuit.

According to other aspects of the invention, preferred embodiments provide steps for activating undervoltage protection or overvoltage protection for the monitored circuit.

According to other aspects of the invention, preferred embodiments provide steps for activating undercurrent protection or overcurrent protection for the monitored circuit.

According to yet another aspect of the invention, preferred embodiments of circuit monitoring and switching methods include steps for providing signal level data relating to the monitored circuit.

According to another aspect of the invention, an example of a preferred embodiment of a floating gate monitoring circuit is configured for activating output indicative of signal level based upon comparison of the programmable floating gate with one or more monitored signal level.

According to still another aspect of the invention, in an example of a preferred embodiment, a monitoring circuit for use with a monitored circuit has a reference generator and a biasing module coupled to a power supply of the monitored circuit. The monitoring circuit is configured for monitoring a signal level in the monitored circuit and for providing an output when one or more predetermined signal thresholds is reached.

According to another aspect of the invention, in an example of a preferred embodiment, a monitoring circuit for use with a monitored circuit has a reference generator and a biasing module connected to a power supply of the monitored circuit. A comparator is coupled to the monitored circuit and reference generator for comparing a reference level to a signal level in the monitored circuit, and for alternately coupling and decoupling the power supply and the load when predetermined signal thresholds are reached.

According to yet another aspect of the invention, in preferred embodiments the biasing module consumes ultra-low current from the power supply in the coupled state, and consumes no current from the power supply in the decoupled state.

According to yet another aspect of the invention, the monitoring circuit according to preferred embodiments of the invention includes means for activating alerts when predetermined signal thresholds are reached.

According to still another aspect of the invention, an example of a preferred embodiment of a circuit monitoring system includes a floating gate monitoring circuit having a programmable floating gate and signal comparison means. The monitored circuit is connected with the floating gate monitoring circuit such that one or more signals of the monitored circuit may be compared with the programmable floating gate. An output device connected to the monitored circuit and controlled with the floating gate monitoring circuit may be activated based upon comparison of the programmable floating gate with one or more monitored signal level.

According to another aspect of the invention, an example of a preferred embodiment of a circuit monitoring system with a programmable floating gate and signal comparison means includes a switch connected to the monitored circuit which may be used to cause the monitored circuit to change state based upon comparison of the programmable floating gate with one or more monitored signal level.

According to another aspect of the invention, preferred embodiments are configured to consume no current when operating in an "OFF" state.

The invention has advantages including but not limited to monitoring and switching efficiency and ultra-low power requirements. These and other advantageous features and benefits of the present invention can be understood by one of ordinary skill in the arts upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which.

References in the detailed description correspond to like references in the various drawings unless otherwise noted. Descriptive and directional terms used in the written description such as first, second, top, bottom, upper, side, et cetera, refer to the drawings themselves as laid out on the paper and not to physical limitations of the invention unless specifically noted. The drawings are not to scale, and some features of embodiments shown and discussed are simplified or amplified for illustrating principles and features, as well as anticipated and unanticipated advantages of the invention.

DESCRIPTION OF PREFERRED EMBODIMENTS

While the making and using of various exemplary embodiments of the present invention are discussed herein, it should be appreciated that the invention provides inventive concepts which can be embodied in a wide variety of specific contexts. It should be understood that the invention may be practiced with various electronic circuits, microelectronic circuit components, systems and subsystems without altering the principles of the invention. For purposes of clarity, detailed descriptions of functions, components, and systems familiar to those skilled in the applicable arts are not included. In general, the invention provides monitoring and switching circuits and methods with ultra-low power consumption attributes preferably on the order of approximately one milliamp or less, often far less.

Figure 1:
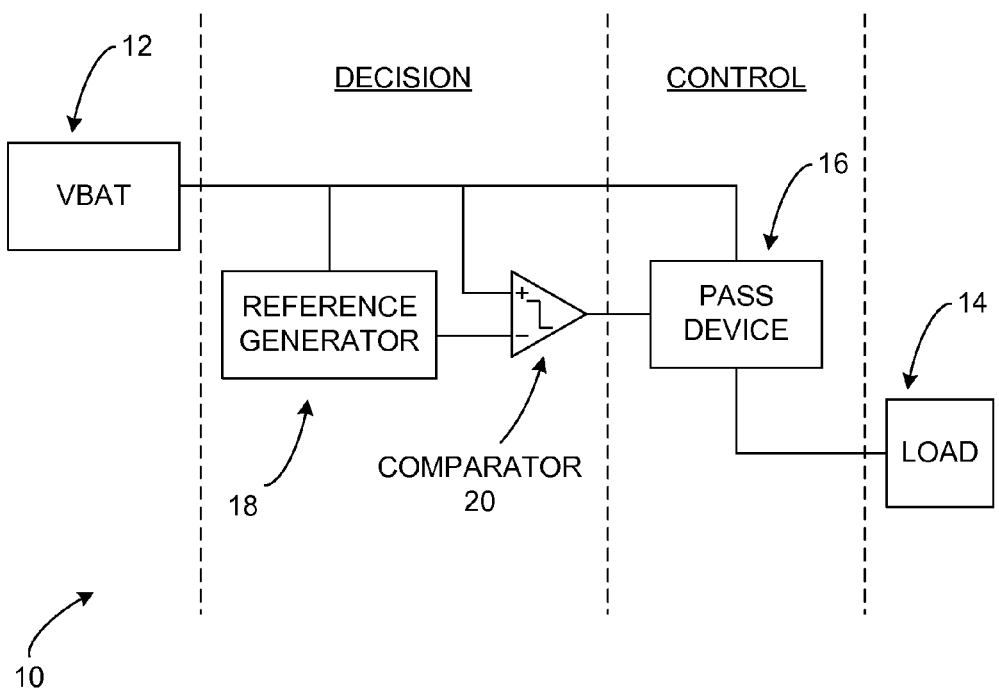
FIG. 1 is a simplified schematic diagram of a preferred embodiment of the invention.

FIG. 1 shows a simplified block diagram illustrating an example of a preferred implementation of circuit monitoring system circuitry 10 and methods according to the invention. A power supply 12, preferably a battery, such as a lithium-ion battery for example, is operably coupled to a load 14, passing through an intermediate pass device 16 used to control decision outputs to some degree. In addition, a reference generator 18 and comparator 20 are suitably arranged for monitoring the voltage at the power supply 12, in this case battery voltage level. While operating in the "ON" state, the reference generator 18 and comparator 20 are preferably biased with minimal current drawn from the power supply 12, although various biasing modules may be used. In the event that the voltage at the power supply 12 is within a predetermined operating range, the pass device 16 couples power to the load 14. In the event the power supply 12 reaches a pre-programmed voltage threshold, unacceptably low voltage for example, then the intervening pass device 16 is employed to decouple the power supply 12 from further depletion by the load 14. In this instance, in the "OFF" state, the reference generator 18 and the comparator 20 consume no quiescent current from the power supply 12. The only current drawn in such instances is the miniscule leakage current found in non-ideal devices. In the event the voltage level at the power supply 12 returns to an acceptable level, the circuit 10 returns to the "ON" state, again coupling the power supply 12 to the load 14. It should be appreciated that the principles and approach of the invention may also be used for monitoring and switching, or providing other output based on current or power levels, by making suitable modifications to the circuitry within the capabilities of those reasonably skilled in the arts. Those skilled in the arts will also appreciate that the invention may be implemented using various components and their equivalents, for example, and op amp or analog to digital converter may be substituted for the comparator of the embodiment of FIG. 1 without departure from the invention.

Figure 2:
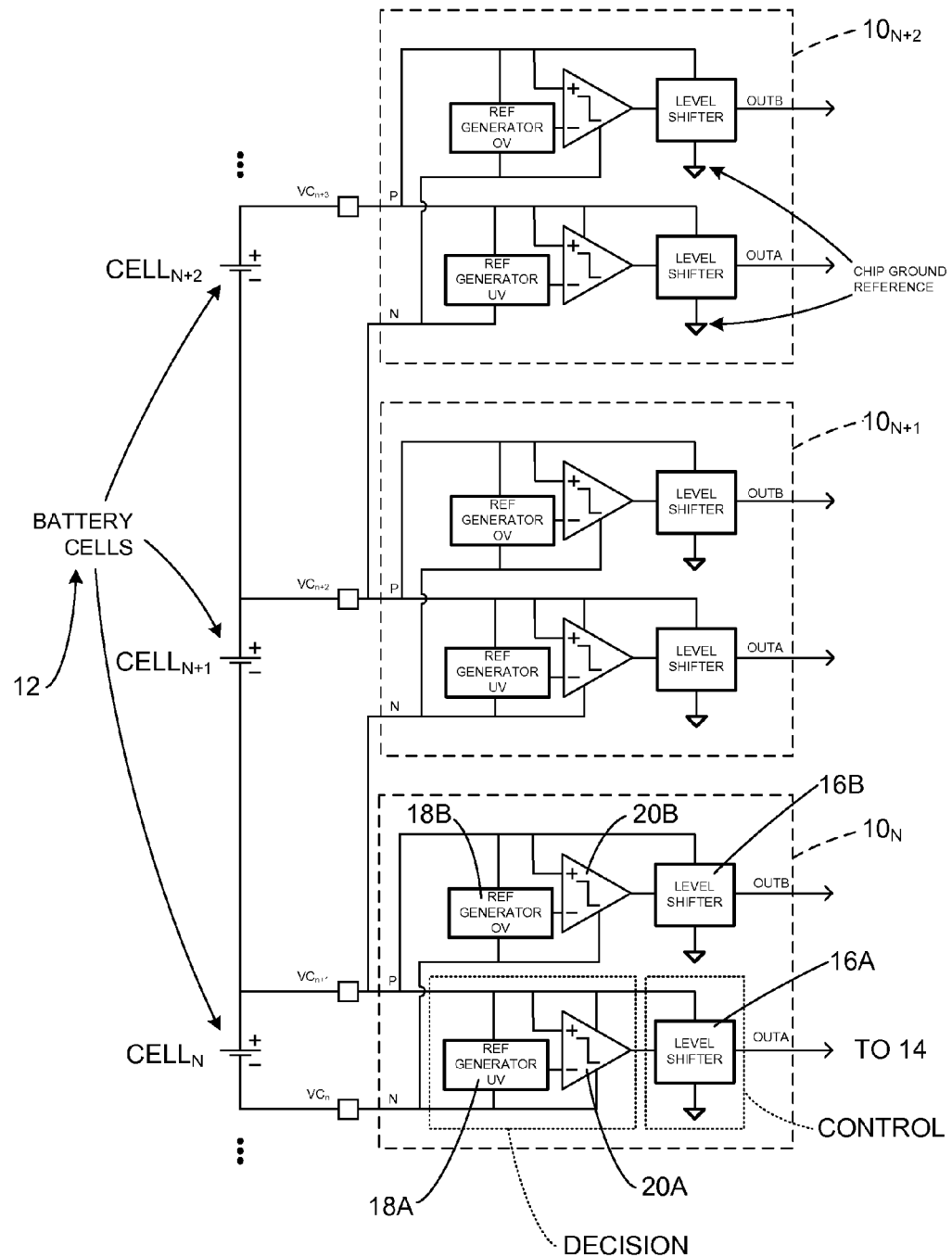
FIG. 2 is a simplified schematic diagram of an additional example of a preferred embodiment of the invention.

Now referring primarily to FIG. 2, further aspects of the invention are described with reference to a particular exemplary embodiment illustrating the use of the invention for both undervoltage and overvoltage protection useful in the context of a wide range of microelectronic circuits. Similar to the circuit described with reference to FIG. 1, the circuit 10 of FIG. 2 is configured for undervoltage detection, in this case for multiple battery cells of a power supply, as well as for overvoltage monitoring and switching capabilities. As shown in the conceptual block diagram, battery cells $CELL_N$, $CELL_{N+1}$, and $CELL_{N+2}$ are arranged in a stacked configuration providing a power supply 12. In this case three cells are shown for the sake of example. Of course, the invention itself is not limited to any particular number of cells and may be practiced with one or innumerable cells. Each of the cells is preferably connected to a respective monitoring circuit $10_N$, $10_{N+1}$, $10_{N+2}$ as shown. Each monitoring circuit $10_N$, $10_{N+1}$, $10_{N+2}$ has two input terminals, herein denominated P and N, and an undervoltage output terminal $OUT_A$. Focusing on a single cell, $CELL_N$, for the sake of this example, in order to monitor voltage at the cell $CELL_N$, $VC_{n-1}$ is connected to the positive terminal P of the monitoring circuit $10_N$, and $VC_n$ is connected to the negative terminal N of the monitoring circuit $10_N$. The undervoltage reference generator block 18A, in the monitoring circuit $10_N$, produces a reference level used by a comparator 20A to determine whether the voltage for that monitored battery cell $CELL_N$, is below a selected low voltage threshold, indicating an undervoltage state. In this event, the comparator 20A, changes state, in this example outputting a "LOW" indicating that the battery $CELL_N$ that the detection circuit is monitoring is in an undervoltage state. In the event the battery $CELL_N$ voltage is higher than the undervoltage reference level, then the comparator 20A outputs a "HIGH" state at $OUT_A$. The output may be used to activate a switch, provide signal data, or activate an alert. For example, the output at $OUT_A$ may be a numerical voltage reading, a low voltage alarm, or activation of an undervoltage protection switch. Combinations of various outputs may also be provided.

Figure 3:
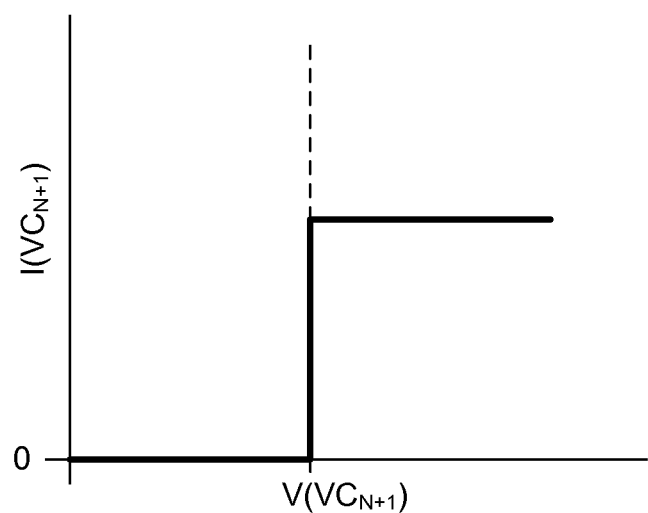
FIG. 3 is a diagram depicting an example of voltage and current characteristics in preferred embodiments according to the invention as shown in the example of FIG. 2.

As shown, the battery cells in a power supply 12 of a typical application may be stacked, and preferably each one of the monitoring circuits 10 is designed to detect a differential voltage across the cells. Hence, the logic level output of each of the undervoltage comparators 20 is referenced to the "N" terminal, and not to the ground of the device. A level shifter 16 is preferably used in each of the monitoring circuits 10 to shift the output $OUT_A$ of the undervoltage comparator 20A and provide a ground-referenced logic signal. When the voltage on $CELL_N$ is higher than the reference level, there is a minimal current draw from the positive terminal P of the monitoring circuit 10. However, a feature of the voltage monitoring circuit is that when the voltage on the monitored cell is lower than the reference voltage, the monitoring circuit uses no current, thus consuming zero current, except possibly for parasitic leakage current found in non-ideal components. This attribute of the monitoring circuit prevents an undervoltage cell from further discharging and decreasing its voltage further. Protecting the cell voltage from dropping further than the undervoltage reference level prevents cell damage such as reducing its charge carrying capacity or destruction beyond usability. An illustration of a typical ideal current draw for the undervoltage protection circuitry (of FIG. 2) versus cell voltage is shown in FIG. 3, showing a fixed current usage for an "ON" state, and zero current usage in an "OFF" state.

It should be understood that the circuits and methods of the invention described herein are applicable to overvoltage protection as well as undervoltage protection. Again referring primarily to FIG. 2, an exemplary embodiment of the invention includes overvoltage protection for each of the cells, $CELL_N$, $CELL_{N+1}$, $CELL_{N+2}$ of the power source 12. An overvoltage reference generator 18B for example, is connected to the positive terminal P of the monitoring circuit $10_N$, and $VC_n$ is connected to the negative terminal N of the monitoring circuit $10_N$. The overvoltage reference generator 18B in the monitoring circuit $10_N$, produces an upper reference level used by the comparator 20B to determine whether the voltage for that battery cell $CELL_N$, is above a selected high voltage threshold, indicative of an overvoltage state. In this event, the comparator 20B, changes state, in this example outputting a "HIGH" at the overvoltage output $OUT_B$ indicating that the battery $CELL_N$ that the monitoring circuit $10_N$ is monitoring is in an overvoltage state, and preferably decoupling the cell $CELL_N$ from the load 14. In the event the battery $CELL_N$ voltage is lower than the reference level, then the comparator 20B outputs a "LOW" state at overvoltage output $OUT_B$, permitting the cell $CELL_N$ to remain coupled to the load 14.

Thus, it can be seen from the example that when the monitoring and switching circuit, such as circuit $10_N$ in this example, is in a "LOW" state for both undervoltage and overvoltage, the monitored cell is permitted to provide power to a load, and the monitoring circuit itself draws minimal current from the cell, in order to continue its detection functions. In the event either the undervoltage or overvoltage is in a "HIGH" state, the cell is protected from being drawn down further, or from overvoltage events, by being disconnected from the load.

It should be appreciated that the circuits, architecture, and methods of the invention may be used to provide similar monitoring circuits for the purposes of monitoring voltage by setting virtually any selected reference level, or multiple levels depending upon system requirements. Such an implementation operates in the manner shown and described. Additional reference levels for each cell may be provided depending upon system needs. For example, various alert levels may be provided for overvoltage and/or undervoltage condition warning thresholds at levels reached prior to the cell voltage becoming precariously low or precariously high and triggering the undervoltage or overvoltage fault thresholds. Similar implementations may be used for monitoring current or power levels without departure from the invention.

Various implementations of the invention are possible, and all variations of potential embodiments cannot, and need not, be shown herein. It should be understood that each of the examples herein may also be implemented for overvoltage and/or various intermediate voltage levels in combination with or in substitution for the undervoltage conditions described for illustration purposes. Likewise, with suitable modifications the invention may also be used for monitoring, measuring, and switching based on current and/or power levels. A further example and description of the operation of an embodiment of monitoring and switching circuitry 10 is described in more particular detail with reference to FIG. 4. To further understanding of the operation of the circuit 10, it should first be noted that the reference generator 18 is implemented in this exemplary embodiment using a floating n-gate transistor M1 to provide a floating n-gate node 22. Other types of floating gate devices may also be used. The floating gate node 22 is programmed to respond to a selected low voltage threshold, holding transistor M3 in an "OFF" state, thereby ensuring that the power source VBAT 12 remains disconnected from supplying power to the load 14. In this example, when in the "OFF" state, the devices connected directly to the power supply, e.g., in this example through transistors M1, M3, and M7, consume no power, limiting current draw to the level of leakage of the devices. The power source 12 voltage, as it increases beyond the programmed low voltage threshold, meets high impedance at the p-gate node 24 of transistor M3, causing leakage to drive the node 24 higher. In this example, transistor M20 is used to provide biasing at the p-gate node 24, although other circuit elements such as resistors may be used. When the voltage level at the power supply 12 is sufficiently high, the transistor stack loop MSTACK (preferably an array of transistors) is activated, whereby the output transistor M7 is enabled, permitting power to be delivered to the load 14. When delivering power from the power supply 12 to the load 14, the current consumption of the circuit 10 in the "ON" state is limited by the transistor stack loop MSTACK and a resistor stack loop RSTACK. Preferably, selectable hysteresis is introduced by suitable means, such as by the use of one or more transistors, e.g., M4, for adjusting the resistor stack RSTACK.

Figure 4:
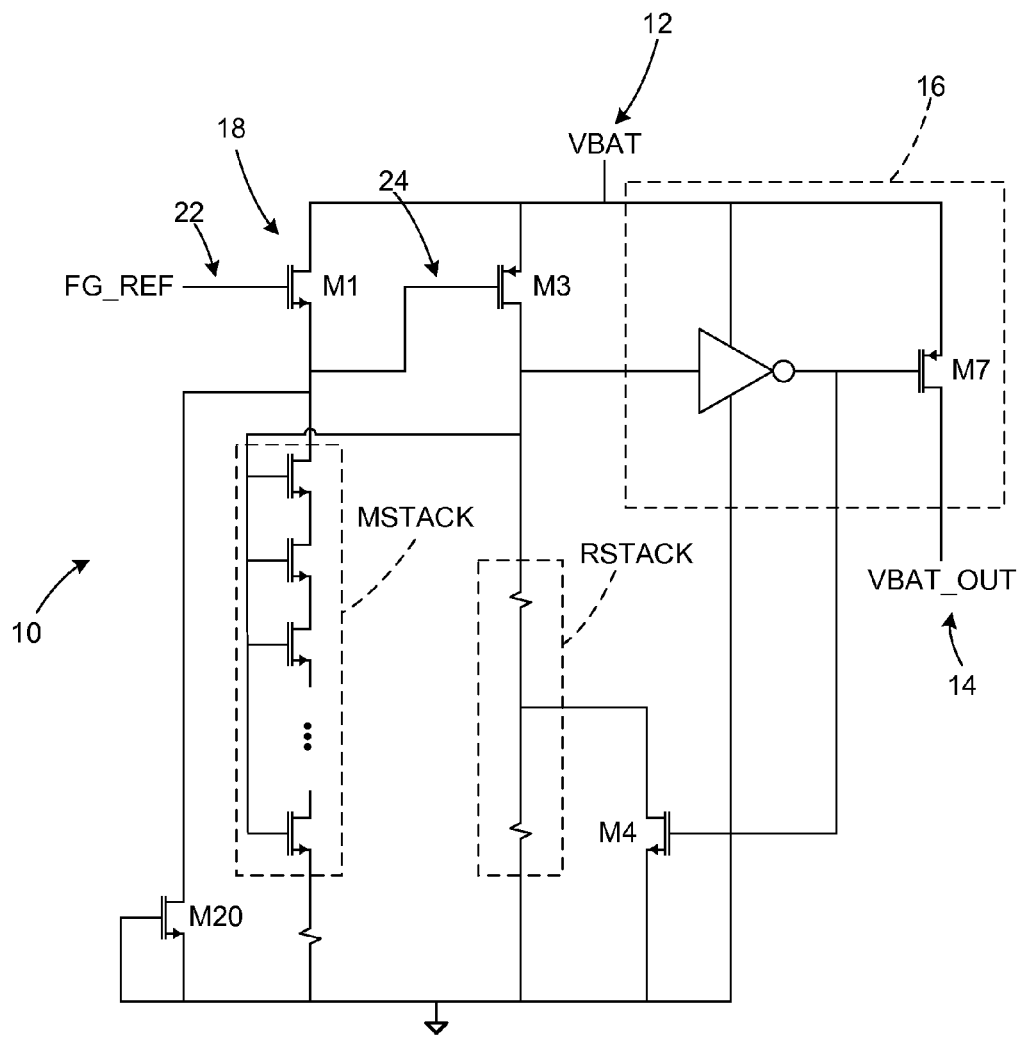
FIG. 4 is a schematic diagram of an alternative preferred embodiment of the invention.
Figure 5:
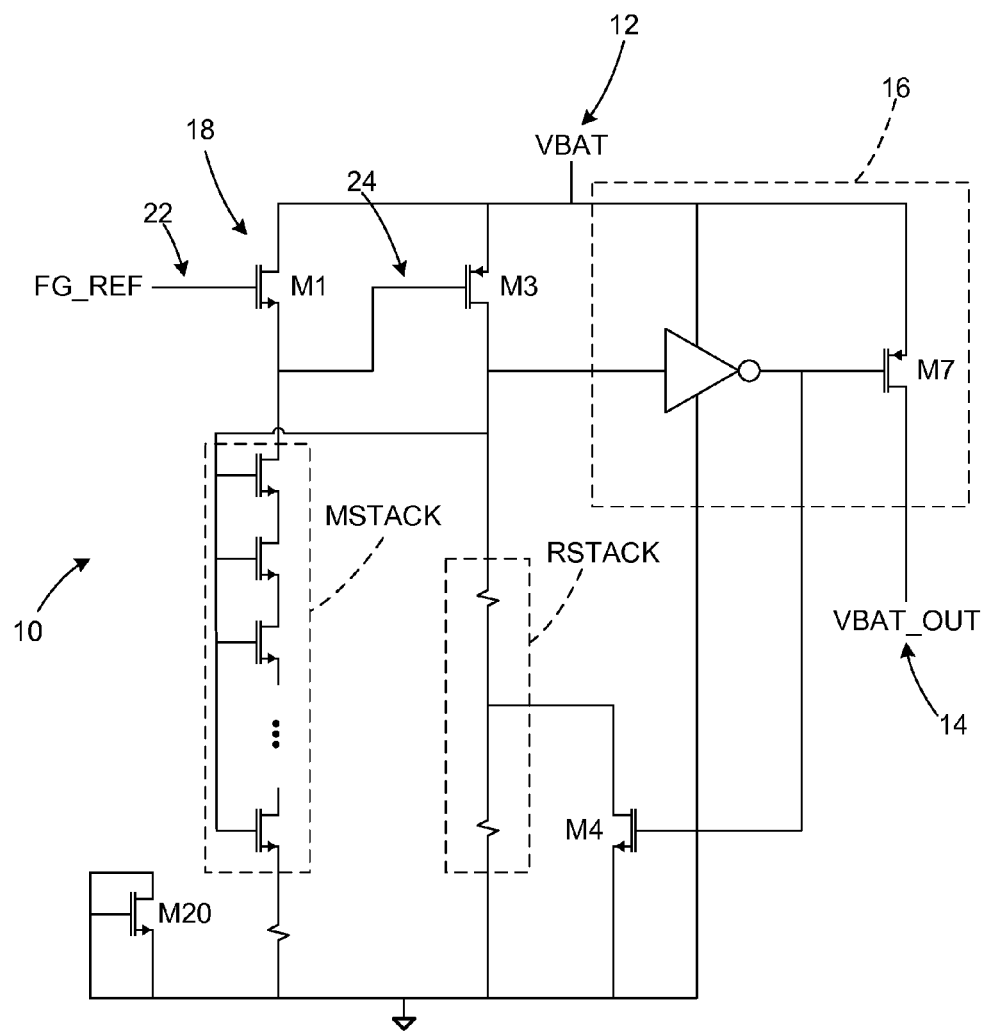
FIG. 5 is a schematic diagram of an alternative preferred embodiment of the invention.

A further example of a preferred embodiment of an undervoltage monitoring and switching circuit 10 is shown in FIG. 5. In this alternative configuration, the circuit 10, similar to that of FIG. 4, is arranged to minimize the use of bias current in the "OFF" state. In this implementation, transistor M1 is used to conduct an ultra-low current in order to bias the p-gate node 24. In other respects, the circuit 10 of FIG. 5 operates in the manner described above. It should be noted that the exemplary embodiment of the invention shown in and described with respect to FIG. 4 preferably uses ultra-low current when in the "ON" state, and no current, with the possible exception of leakage current due to non-ideal components, in the "OFF" state. The exemplary circuit of FIG. 5 also uses ultra-low current when in the "ON" state. The implementation of FIG. 5, however, uses ultra-low current when in the "OFF" state as well. It is anticipated that implementations exemplified by the circuit of FIG. 5 may be particularly useful in applications in which it is advantageous to overpower leakage currents with affirmative biasing, as in temperature-sensitive applications where junction leakages could potentially cause temperature increases. Thus, by applying a small bias current, leakage, and therefore related temperature increase, is avoided.

Figure 6:
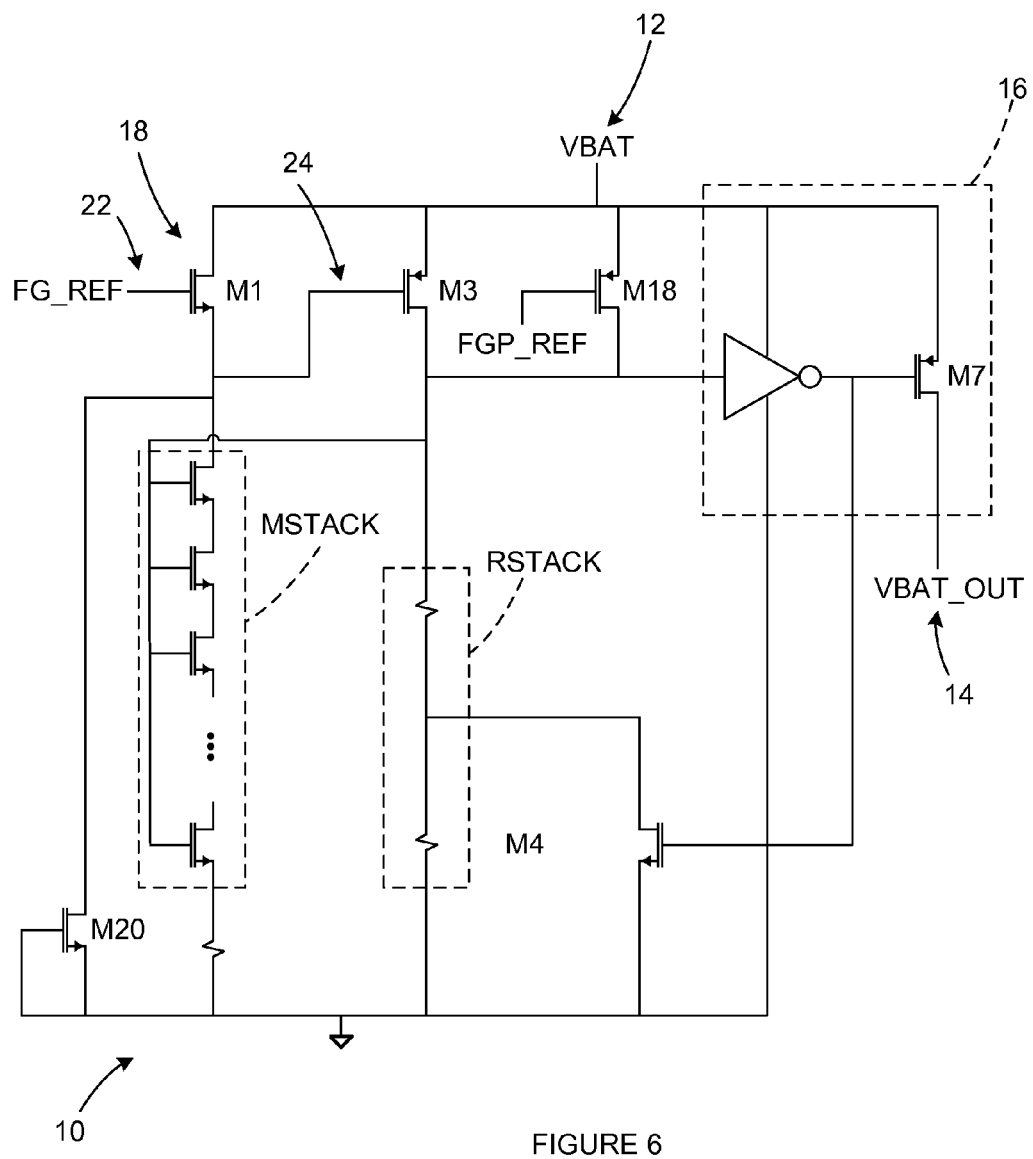
FIG. 6 a schematic diagram of an alternative preferred embodiment of the invention.
Figure 7:
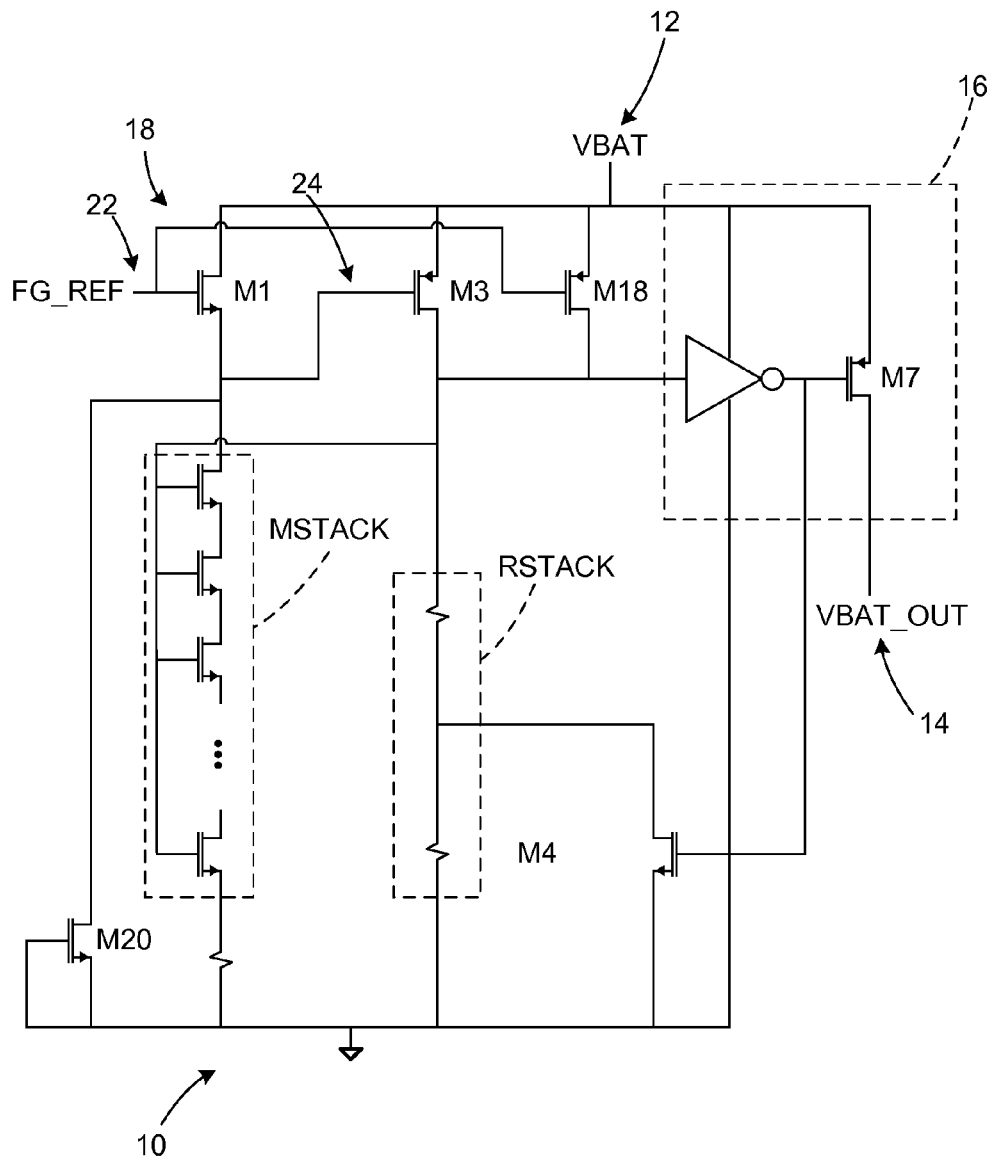
FIG. 7 a schematic diagram of an alternative preferred embodiment of the invention.

An additional example of an alternative embodiment of an undervoltage monitoring and protection circuit is shown in FIG. 6, in which, although similar in other respects, it can be seen that an additional floating gate PMOS transistor M18 is used in order to adjust the power source 12 rising voltage trigger point. With this particular configuration, hysteresis from the resistor stack RSTACK and transistor M4 may or may not be used to advantage, depending upon the particulars of the application. In terms of functionality, transistor M18 serves as an additional comparator used only during the increase of the power supply 12 voltage during the transition from the "OFF" state to the "ON" state. The circuit shown in FIG. 7 is similar to that of FIG. 6, with the exception that the floating gate reference 22 is shared by coupling the NMOS transistor M1 and PMOS transistor M18 gates. This avoids the use of a separate floating gate reference generator when independent control of rising and falling threshold detection is not required.

Figure 8:
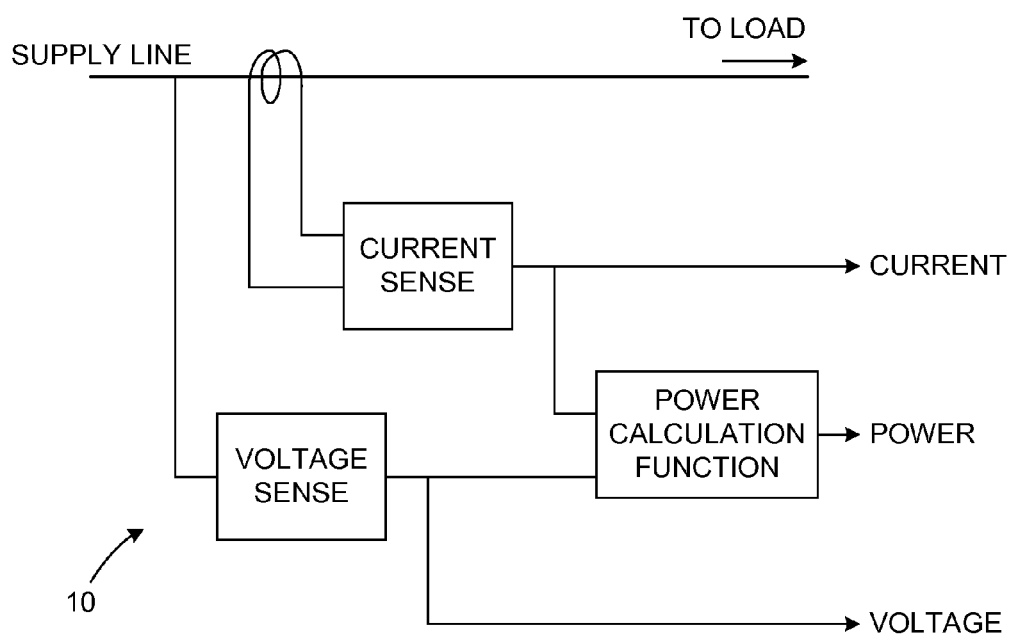
FIG. 8 is a schematic diagram of an alternative preferred embodiment of the invention.

An additional example of a monitoring system 10 is shown in FIG. 8, illustrating voltage, current, and power monitoring and switching capabilities used in combination in a single application. In this circuit 10, coupled between one or more power source supply line and one or more load, current, voltage, and power characteristics are monitored for performance within acceptable ranges using suitable means. Comparison of actual conditions with predetermined reference criteria provides bases for providing output such as signal data, alerts, or switch activation, according to the preferences of the user.

The methods and apparatus of the invention provide one or more advantages including but not limited to furnishing ultra-low power circuits, circuit architectures, and methods for efficiently monitoring associated circuits. While the invention has been described with reference to certain illustrative embodiments, those described herein are not intended to be construed in a limiting sense. For example, the invention may be used to advantage in various electronic systems having one or more power and load components, such as, portable electronics, stationary electronics, power systems, power and battery management systems, energy systems, and the like. As illustrated by the examples shown and described herein, variations on, or combinations of, components or their arrangement in the monitoring circuit embodiments may be used in particular cases without departure from the invention. Various modifications and combinations of the illustrative embodiments as well as other advantages and embodiments of the invention will be apparent to persons skilled in the arts upon reference to the drawings, description, and claims.

We claim:

1. A monitoring circuit for use with a monitored circuit, the monitoring circuit having an input connected to a power supply and an output connected a load, the monitoring circuit comprising:
   an undervoltage decision circuit coupled to a positive terminal of the power supply, the undervoltage decision circuit including an undervoltage decision output and configured to adjust a logic level of the undervoltage decision output based on a voltage of the positive terminal;
   an undervoltage level shifter receiving the undervoltage decision output and configured to couple or decouple the power supply and the load based on the logic level of the undervoltage decision output;
   an overvoltage decision circuit coupled to the positive terminal of the power supply, the overvoltage decision circuit including an overvoltage decision output and configured to adjust a logic level of the overvoltage decision output based on the voltage of the positive terminal; and
   an overvoltage level shifter receiving the overvoltage decision output and configured to couple or decouple the power supply and the load based on the logic level of the overvoltage decision output.

2. The monitoring circuit of claim 1, wherein the undervoltage decision circuit includes an undervoltage reference generator and a comparator, such that the comparator compares the voltage of the positive terminal to a voltage of the undervoltage reference generator and asserts a logic high on the undervoltage decision output when the voltage of the positive terminal is greater than the voltage of the undervoltage reference generator and a logic low when the voltage of the positive terminal is less than the voltage of the undervoltage reference generator.

3. The monitoring circuit of claim 2, wherein the power supply is coupled to the load when the voltage of the positive terminal is greater than the voltage of the undervoltage reference generator, and the power supply is decoupled from the load when the voltage of the positive terminal is less than the voltage of the undervoltage reference generator.

4. The monitoring circuit of claim 1, wherein the overvoltage decision circuit includes an overvoltage reference generator and a comparator, such that the comparator compares the voltage of the positive terminal to a voltage of the overvoltage reference generator and asserts a logic high on the undervoltage decision output when the voltage of the positive terminal is greater than the voltage of the undervoltage reference generator and a logic low when the voltage of the positive terminal is less than the voltage of the undervoltage reference generator.

5. The monitoring circuit of claim 4, wherein the power supply is coupled to the load when the voltage of the positive terminal is less than the voltage of the overvoltage reference generator, and the power supply is decoupled from the load when the voltage of the positive terminal is greater than the voltage of the overvoltage reference generator.

* * * * *